(12) United States Patent
Haugestuen

(10) Patent No.: US 7,644,331 B2
(45) Date of Patent: Jan. 5, 2010

(54) SYSTEM AND METHOD FOR TESTING AND DEBUGGING ANALOG CIRCUITS IN A MEMORY CONTROLLER

(75) Inventor: Benjamin Haugestuen, Forth Collins, CO (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 616 days.

(21) Appl. No.: 11/190,664

(22) Filed: Jul. 27, 2005

(65) Prior Publication Data

US 2007/0024630 A1   Feb. 1, 2007

(51) Int. Cl.
*G01R 31/28* (2006.01)
*H03L 7/00* (2006.01)
*H03L 7/06* (2006.01)

(52) U.S. Cl. .................. 714/731; 714/724; 327/141; 327/149

(58) Field of Classification Search .............. 714/731, 714/724; 327/141, 149
See application file for complete search history.

(56) References Cited

U.S. PATENT DOCUMENTS

| | | | | |
|---|---|---|---|---|
| 4,707,813 A * | 11/1987 | Moeller et al. | ............... | 367/103 |
| 5,272,729 A * | 12/1993 | Bechade et al. | ............. | 375/371 |
| 5,821,786 A * | 10/1998 | Nozuyama et al. | .......... | 327/141 |
| 6,286,119 B1 * | 9/2001 | Wu et al. | ..................... | 714/726 |
| 6,417,713 B1 * | 7/2002 | DeRyckere et al. | ......... | 327/271 |
| 6,753,709 B2 * | 6/2004 | El-Kik | ....................... | 327/116 |
| 6,774,693 B2 * | 8/2004 | Carr | ........................... | 327/276 |
| 6,877,121 B1 * | 4/2005 | Srinivasaiah et al. | ........ | 714/727 |
| 7,135,906 B2 * | 11/2006 | Takai et al. | .................. | 327/263 |
| 7,154,323 B2 * | 12/2006 | Yamawaki | .................. | 327/277 |
| 2003/0188243 A1 * | 10/2003 | Rajan | .......................... | 714/731 |
| 2005/0242864 A1 * | 11/2005 | Kawasaki et al. | ............ | 327/261 |
| 2006/0190642 A1 * | 8/2006 | Aldereguia et al. | ........... | 710/60 |

* cited by examiner

*Primary Examiner*—John J Tabone, Jr.

(57) ABSTRACT

A method and apparatus is presented for debugging and testing a memory controller. In one embodiment, a testing interface is presented for performing stuck-at testing. In a second embodiment, a testing interface is presented for observing clock timing in a memory controller.

18 Claims, 5 Drawing Sheets

SYSTEM AND METHOD FOR TESTING AND DEBUGGING ANALOG CIRCUITS IN A MEMORY CONTROLLER

BACKGROUND OF THE INVENTION

Description of the Related Art

Most modern electronic/computing systems include a memory and a memory controller. The memory controller generates the signals that control the reading and writing of information to and from the memory. In addition, in some implementations the memory controller interfaces the memory with the other major parts of the electronic/computing system. The memory controller may be implemented as an integrated part of the system or the memory controller may be implemented on a removable interface.

Memory controllers may be provided separately for integration into system electronics. For example, conventional memory controllers may include processors that can be built into an integrated circuit design and used to control data transfers to and from an external RAM deployed in an electronic/computing system. There are often several analog circuits in these memory controllers and quite often the circuits don't include test circuitry. Since there is no test circuitry the memory controllers are very difficult to debug.

In addition, given the way that many conventional memory controllers are deployed even after circuitry is designed to test the memory controller there are no test ports (i.e., test hooks) to facilitate easy interfacing and testing of the memory controller. One specific testing problem includes clock timing. A significant amount of the digital logic on the memory controller receives a clock that came from off the memory controller (i.e., off chip) and is then processed through a delay line. Since the clock comes from an outside source the timing of the clock is unknown. As a result, testing is impacted because the timing and phase of the clock is unknown.

Thus, there is a need for a method and apparatus for testing a memory controller. There is a need for generating known timing in a memory controller.

SUMMARY OF THE INVENTION

In accordance with the teachings of the present invention, a method and apparatus for testing a memory controller is presented. In one embodiment, a circuit architecture is presented for interfacing with the memory controller and testing the memory controller. In addition, in accordance with the teachings of the present invention, a method is presented for providing a known clock to a memory controller.

In one embodiment the circuit architecture facilitates stuck-at testing on the analog portion of a memory controller. The circuit architecture includes observation circuitry to view the clock inputs and outputs of analog delay lines on the memory controller, which greatly increases the ability to debug the memory controller. In one embodiment, on-chip clocks (i.e., chips positioned on the memory controller) are multiplexed with delay line clocks to provide a clock with a known phase for testing.

As a result of the foregoing, a number of advantages may be realized. For example, stuck-at testing may be performed on the analog circuitry in a memory controller; memory controller delay line clocks may be observed and debugged; and clocks with a known phase may be supplied to the memory controller during test mode.

A memory controller interface, comprises a logic gate generating a first output in response to a first high signal or a low signal; a first multiplexer coupled to the logic gate, the first multiplexer generating a second output in response to the first output, in response to a second high signal, and in response to a test clock signal; and a second multiplexer coupled to the first multiplexer, the second multiplexer generating a third output signal in response to the second output signal, in response to a system clock signal and in response to a test mode signal.

A method of interfacing with a memory controller interface, comprises the steps of providing a delay line comprising an input for receiving data, a plurality of delay elements including a last delay element and a plurality of registers associated with the delay elements; forcing the delay line high; scanning first data the plurality of registers in response to forcing the delay line high; stepping a test clock signal in response to scanning the data into the selected registers; scanning second data out of the plurality of registers in response to stepping the test clock signal; and comparing the second data in response to scanning the data out of the delay line registers and if the last delay element is selected, forcing the delay line high in response to comparing the second data.

A clock observation circuit for interfacing with a memory controller, the clock observation circuit comprises an input communicating an input clock signal; a test access port generating a selection signal; an input multiplexer coupled the input and coupled to the first access port, the input capable of communicating the input clock signal to a delay line in response the selection signal; an output multiplexer coupled to the test access port and capable of communicating an output clock signal from a delay line in response to communicating the input clock signal to the delay line in response to the selection signal; an output coupled to the output multiplexer and generating the output clock signal in response to in response to communicating the output clock signal from the delay line.

DETAILED DESCRIPTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
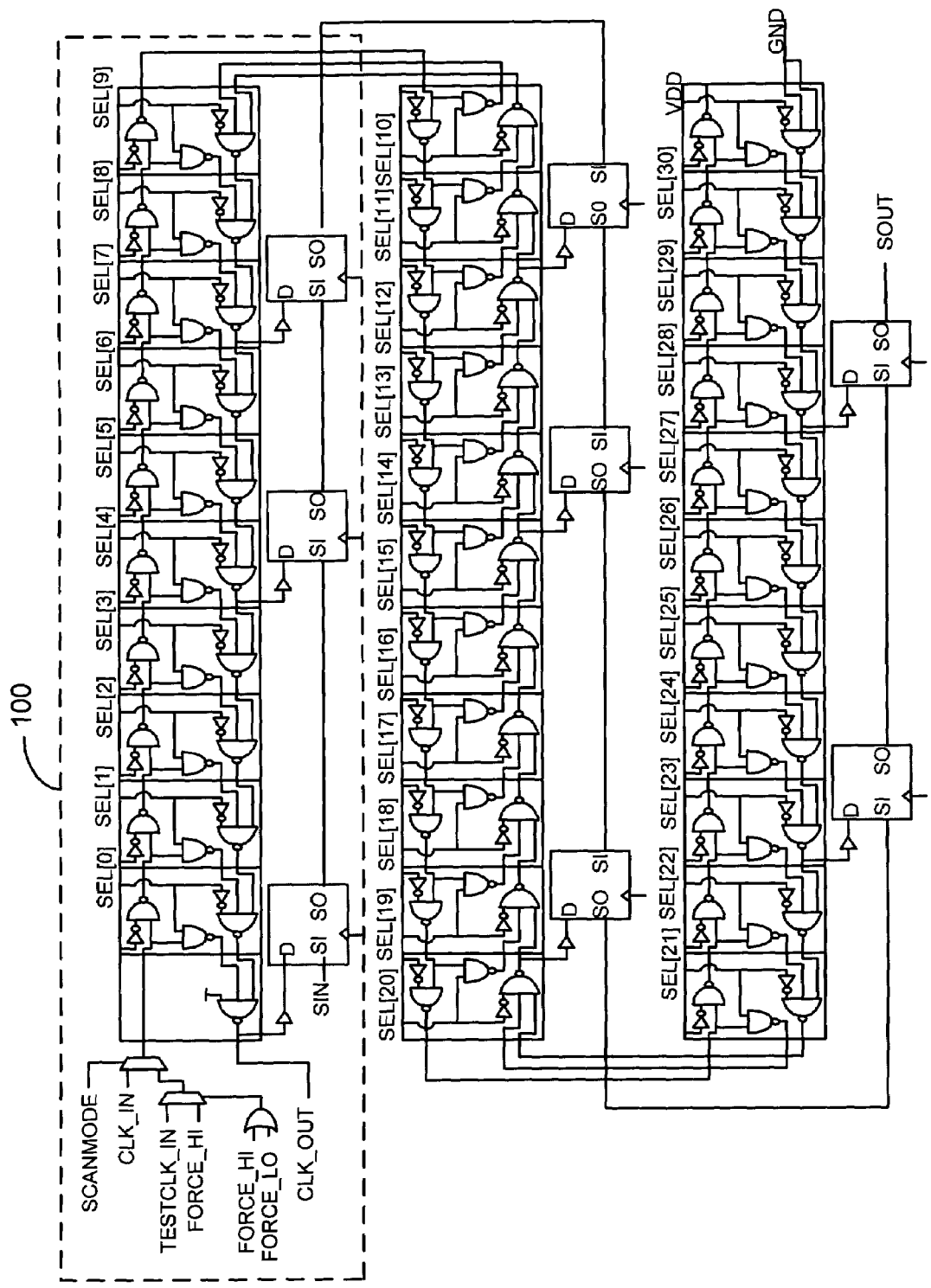
FIG. 1 displays an architecture implemented in accordance with the teachings of the present invention.

In accordance with the teachings of the present invention, a circuit architecture is presented for testing a memory controller. In one embodiment the circuit architecture is used to interface with a delay line. In addition, a circuit and method for providing a known clock to a delay line architecture is presented. FIG. 1 displays an architecture implemented in accordance with the teachings of the present invention. A delay line is shown as 100. A test interface to the delay line 100 is shown as 102.

Figure 2:
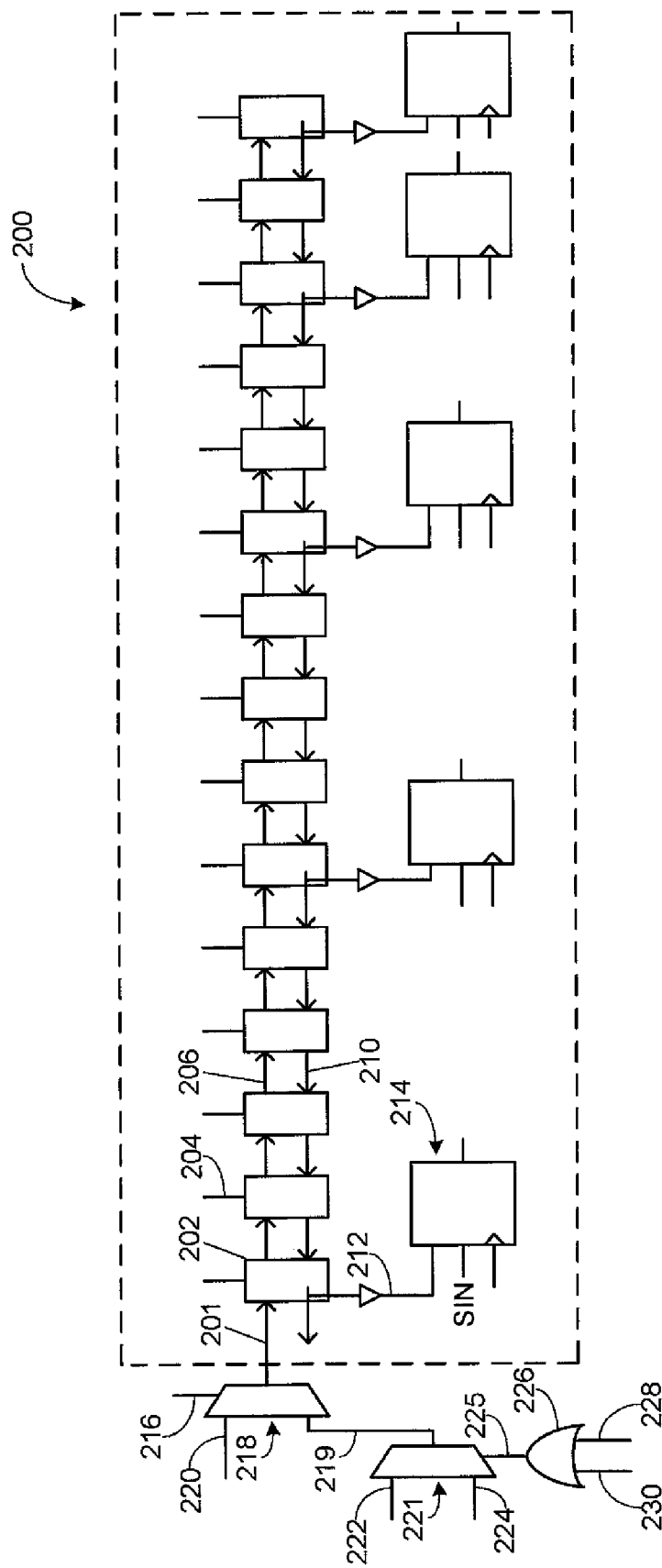
FIG. 2 displays a detailed embodiment of a portion of the architecture displayed in FIG. 1.

FIG. 2 displays a detailed embodiment of a portion of the architecture displayed in FIG. 1. A delay line 200 is shown. The delay line 200 includes several delay elements 202. Each delay element 202 is selected using a select input 204. In addition, each delay element 202 is connected with a forward path 206, a reverse path 210, and a read path 212. In one embodiment, signals propagate through the delay elements 202 in the forward direction using the forward path 206. Signals return through the delay elements 202 in a reverse direction using the reverse path 210 and the state of a delay element 202 is read using the read path 212.

Memory storage elements such as flip-flops 214 are connected to the read path 212. The memory storage elements (i.e., flip-flops 214) may be positioned between each delay element 202 or the memory storage elements (i.e., flip-flops 214) may be evenly or unevenly spaced between the delay elements 202 depending on the desired granularity of testing that is required.

In one embodiment, delay line 200 is used to delay clocks going into and coming out of a memory controller. During operation, a clock signal is applied through input 201. Each delay element 202 provides a certain resolution so that an input signal conveyed on 201 may be changed based on the delay elements 202 selected using the select 204. Each select 204 determines if a signal passes through that delay element 202 or returns through that delay element 202. For example, a technician may select the fourth delay element 202. As a result, a signal passes through the unselected delay elements and then returns back through the selected delay elements. As such, the delay elements 202 may be used to delay a signal such as a clock signal i.e., delay the phase of your clock. The flip-flops 214 are storage elements. The Flip-flops 214 capture the value stored in the nearest delay element 202 and the value is then compared to an expected value.

In one embodiment, stuck-at-testing is performed. A stuck-at-condition occurs when a delay element 202 maintains the same state. The registers (i.e., flipflops 214) are strategically placed inside the delay line 200 to capture the state of the delay line 200 while the select line 204 is incremented from its lowest value to its highest value. Setting the delay line 200 to a zero and incrementing though each delay element 202, and then setting the delay line 200 to a one and incrementing through each delay element 202 facilitates stuck-at testing without compromising the functionality of the delay line 200 itself.

During operation a signal is introduced into the delay line 200 using input 201. Delay elements 202 are selected using the select input 204. The signal propagates through the forward path 206 until the signal reaches the delay element 202 selected by the select input 204. The signal then returns on the reverse path 210. In one embodiment, each flip flop 214 prior to the delay element 202 selected using the select input 204, uses the read path 212 to store a value (i.e., 0 or 1) of the signal. The values stored in the flip-flops 214 may then be analyzed to troubleshoot the delay elements 202. It should be appreciated that the flip-flops 214 may be positioned at different locations to get a different resolution of coverage.

A first multiplexer 218 is connected to the input 201. The first multiplexer 218 receives a scan mode signal 216 and a normal clock operation signal 220. In one embodiment, the scan mode signal 216 places a system in scan mode to perform testing such as scan mode testing and stuck-at testing. In one embodiment, the normal clock operation signal 220 is a clock (i.e., timing signal) generated by the interface controller.

A testing signal is conveyed on connection 219 between the first multiplexer 218 and a second multiplexer 221. The second multiplexer 221 receive a test clock signal 222, a Force Hi signal 224 and an output 225 from an OR gate 226. The test clock signal 222 is an independent clock signal that can be introduced into the circuit architecture of FIG. 1. The Force Hi signal 224 is a signal for forcing a high signal on the input 201. OR gate 226 receives a Force Hi signal on link 230 and a Force Lo signal on link 228 as input. Attention is drawn to FIGS. 1 and 2 that show these signal connections. Assertion of either one of the two signals provided via links 230 and 228 allows selection of either the Force Hi signal 224 or the test clock signal 222 of the multiplexer 221. The Force Hi signal 224 may be set to a 1 or a 0 to provide a 1 or 0 on input 201 and force the delay lines to all ones or to all zeros, respectively.

During operations, to force the input 201 hi and hence the delay line 201 hi, the force hi 230 is set to 1 and the force low 228 is set to 0. As a result, the output of the multiplexer 221 (i.e., connection 219) is high, which is equivalent to 1. During operations to force the input 201 low and hence the delay line 201 low, the force hi 230 is set to 0 and the force low 228 is set to 1. As a result, the output of the multiplexer 221 (i.e., connection 219) is low, which is equivalent to 0.

Figure 3:
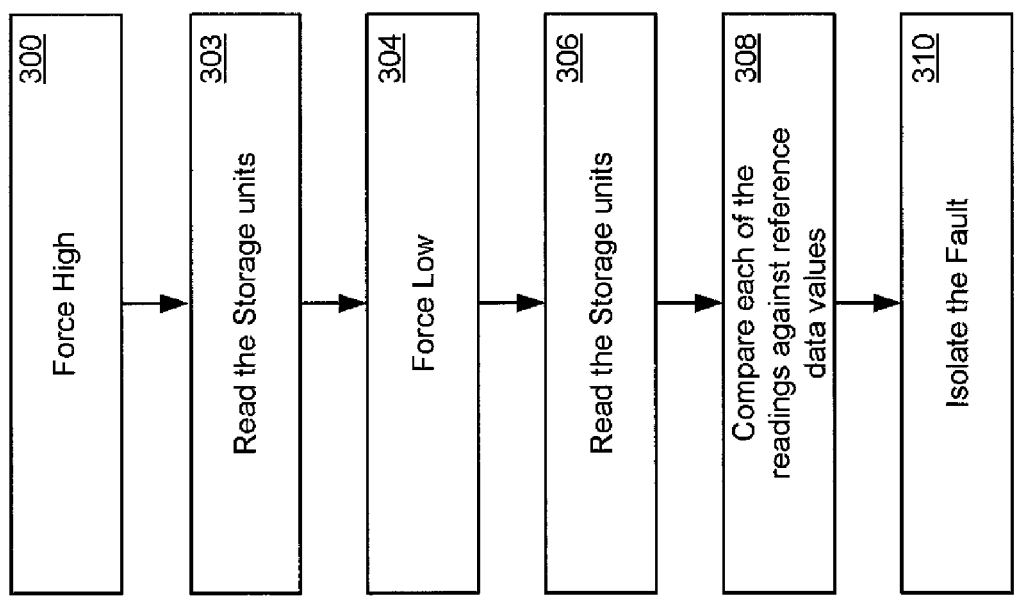
FIG. 3 displays a high-level flow diagram detailing a method implemented in accordance with the teachings of the present invention.

FIG. 3 displays a flow diagram detailing a circuit architecture implemented in accordance with the teachings of the present invention. FIG. 3 will be discussed in conjunction with FIG. 2. A signal is asserted on 216 to place the circuit into the scan mode. When the system goes into scan mode the multiplexer 221 is selected. The multiplexer 221 has an input clock 222 and a force hi signal 224. To test for faults the delay line 200 is forced high as stated at 300. The state of the flip-flops 214 are then read as stated at 303. The delay line 100 is then forced low as stated at 304. The state of the flip-flops 214 are then read as stated at 306. A comparison is then made between the state of the flip-flops when the delay lines 214 were forced high and a first set of reference data values; and the state of the flip-flops when the delay lines 200 were forced low and a second set of reference data values. This comparison is described below using FIG. 4. The comparison may be used to isolate a fault in the delay line 200 as stated at 310. Forcing the delay line 200 high and forcing the delay line 200 low provides information in both directions and then data can be read for a stuck at 1 or stuck at 0 situation (i.e., stuck-at-testing). This is a way of inserting a stuck-at configuration into the delay line 200. When the delay line is forced into a specific state the select lines are controlled so that a technician can step though each element and during each step, capture the values in the associated register.

Figure 4:
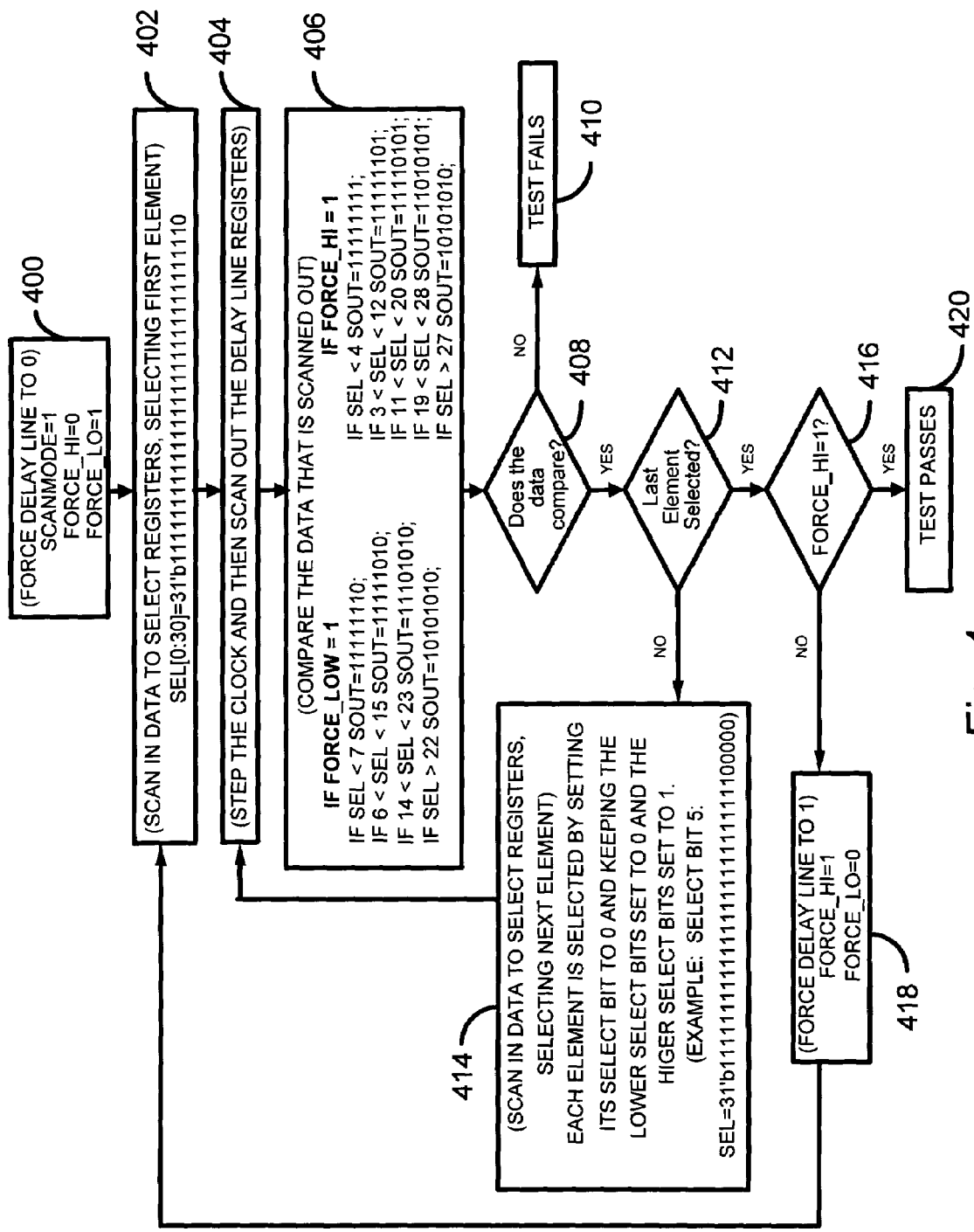
FIG. 4 displays a detailed flow diagram detailing a method implemented in accordance with the teachings of the present invention.

FIG. 4 displays a detailed flow diagram detailing a method implemented in accordance with the teachings of the present invention. FIG. 4 is described in conjunction with FIG. 1. At step 400 the delay line 200 is forced to 0. The scan mode signal 216 is set to 1 the force high signal 230 is set to 0 and the force low signal 228 is set to 1. At step 402, data is scanned in to the delay line 200 to select registers selecting the first element. At step 404, the test clock signal 222 is stepped forward and the delay line register (i.e., 214) is scanned out. At step 406, a comparison is made of the data that is scanned out of the delay line 200. The tables provided below detailed the rules for the comparison:

```
If Force Low = 1:
    IF SEL < 7 SOUT=11111110;
    IF 6 < SEL < 15 SOUT=11111010;
    IF 14 < SEL < 23 SOUT=11101010;
    IF SEL > 22 SOUT=10101010;
If Force Hi = 1:
    IF SEL < 4 SOUT=11111111;
    IF 3 < SEL < 12 SOUT=11111101;
    IF 11 < SEL < 20 SOUT=11110101;
    IF 19 < SEL < 28 SOUT=11010101;
    IF SEL > 27 SOUT=10101010.
```

At step 408, the data is tested to determine if the data compares. If the data does not compare at 410 the test fails. If the data does compare a test is made to determine if the last element has been selected at 412. If the last element has not been selected at 414, data is scanned in to select additional registers by selecting the next element. Each element is selected by setting its select bit 204 to 0 and keeping the lower select bits set to 1. An example, of selecting bit 5 as shown by FIG. 1 is given by the following sequence: SEL=31'b1111111111111111111111111100000). The method then loops back to step 404. At step 416, a comparison is made of the force high input 230 to determine if the force high is set to 1. If the force high is set to 1 the test passes as shown at 420. If the force high is not set to 1, then at step 418 the delay line is forced to 1 by setting the force high signal 230 to 1 and the force low signal 228 to 0.

Figure 5:
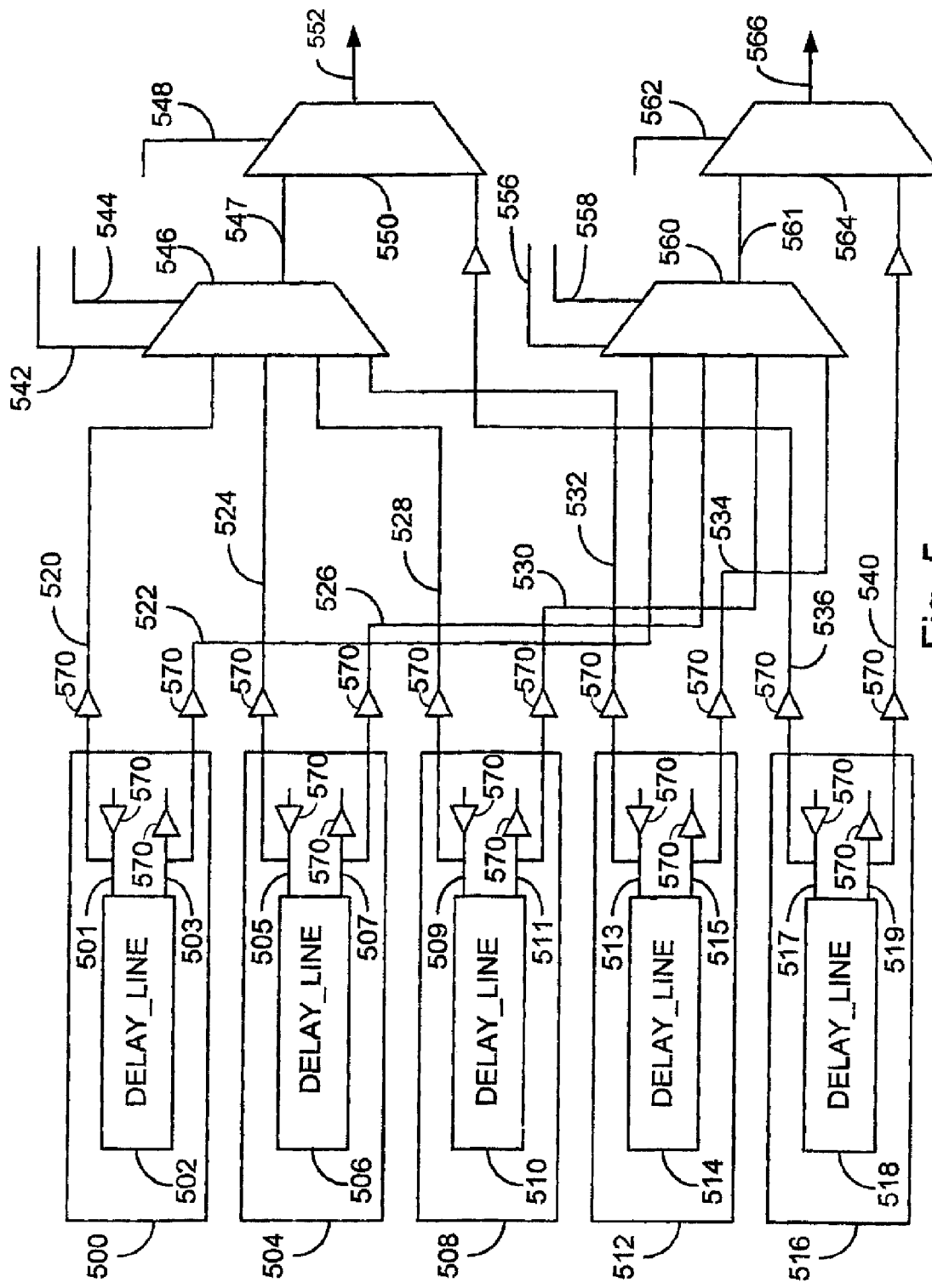
FIG. 5 displays a timing interface to a delay line architecture implemented in accordance with the teachings of the present invention.

FIG. 5 displays a clock observation circuit implemented in accordance with the teachings of the present invention. In one embodiment, FIG. 2 is a clock observation circuit. Memory interfaces 500, 504, 508, 512 and 516 are shown. Each memory interfaces 500, 504, 508, 512 and 516 includes a delay line 502, 506, 510, 514, and 518, respectively. Delay lines 502, 506, 510, 514, and 518 receive inputs on delay line inputs 501, 505, 509, 513, and 517, respectively. Delay lines 502, 506, 510, 514, and 518 provide outputs on delay line outputs 503, 507, 511, 515, and 519, respectively. Input access lines 520, 524, 528, 532 and 536 access delay lines 502, 506, 510, 514 and 518, though delay line inputs 501, 505, 509, 513 and 517. Output access lines 522, 526, 530, 534 and 540 access delay lines 502, 506, 510, 514 and 518 though delay line outputs 503, 507, 511, 515 and 519, respectively. Buffers 570 are positioned on delay line input (i.e., 501, 505, 509, 513, and 517), delay line output (i.e., 503, 507, 511, 515, and 519), input access lines (i.e., 520, 524, 528, 532 and 536) and output access lines (i.e., 522, 526, 530, 534 and 540).

Input access lines 520, 524, 528, 532 and 536 convey signals from delay lines 502, 506, 510, 514 and 518 to multiplexers 546 and 550. Multiplexers 546 and 550 are interconnected via link 547. A "clock input" signal 552 is transmitted out of multiplexer 550. Test Access Ports (TAP) 542 and 544 are connected to multiplexer 546. TAP 548 is connected to multiplexer 550. Output lines 522, 526, 530, 534 and 540 convey an output signal to multiplexers 560 and 564. Multiplexers 560 and 564 are interconnected via link 561. A "clock output" signal 566 is transmitted out of multiplexer 564. Test Access Ports (TAP) 556 and 558 are connected to multiplexer 560. TAP 562 is connected to multiplexer 564.

In one embodiment, during operations, the architecture shown in FIG. 5 is placed into test mode. Core clocks were multiplexed with the outputs of the delay lines. As a result, clocks with known phases are supplied to the digital logic that received these clocks.

As shown in FIG. 5 different delay lines (i.e., 502, 506, 510, 514 and 518) are presented. However, a multitude of other delay lines may be presented. Each delay line has a buffer 570 on delay line inputs 501, 505, 509, 513, and 517 that provides inputs to the delay lines (i.e., 502, 506, 510, 514 and 518) and a buffer is placed on the delay line output 503, 507, 511, 515, and 519, that provide output signals from the delay lines (i.e., 502, 506, 510, 514 and 518). In one embodiment, a symmetrical buffer 570 is positioned on the delay line input (i.e., 501, 505, 509, 513, and 517) and the delay line output (i.e., 503, 507, 511, 515, and 519). Input access lines (i.e., 520, 524, 528, 532 and 536) tap into the delay line input (i.e., 501, 505, 509, 513, and 517), and output access lines (i.e., 522, 526, 530, 534 and 540) tap into the delay line output (i.e., 503, 507, 511, 515, and 519). In one embodiment, symmetrical buffer 570 is positioned on Input access lines (i.e., 520, 524, 528, 532 and 536) and on output access lines (i.e., 522, 526, 530, 534 and 540).

Each delay line (502, 506, 510, 514 and 518) includes a buffer 570 on the delay line input (i.e., 501, 505, 509, 513, and 517) and the delay line output (i.e., 503, 507, 511, 515, and 519). Input access lines (i.e., 520, 524, 528, 532 and 536) is used to tap into the delay line input (i.e., 501, 505, 509, 513, and 517), and output access lines (i.e., 522, 526, 530, 534 and 540) is used to tap into the delay line output (i.e., 503, 507, 511, 515, and 519). Each of the input access lines (i.e., 520, 524, 528, 532 and 536) and output access lines (i.e., 522, 526, 530, 534 and 540) are then sent though a first multiplexer pair 546 and 550 and a second multiplexer pair 560 and 564 respectively, so that each access line (i.e., 520, 524, 528, 532 and 536, 522, 526, 530, 534 and 540) may be selected individually.

During operation, the "clock input" signal 552 and the "clock output" signal 566 are observed. Therefore, a clock signal is observed before it enters a delay line and then after it exits the delay line. Symmetric buffers are applied uniformly throughout the design to apply a comparable amount of delay on the input and on the outputs. The two stage multiplexer, which comes from a test access port is used to select which delay line for observation.

Thus, the present invention has been described herein with reference to a particular embodiment for a particular application. Those having ordinary skill in the art and access to the present teachings will recognize additional modifications, applications, and embodiments within the scope thereof.

It is, therefore, intended by the appended claims to cover any and all such applications, modifications, and embodiments within the scope of the present invention.

What is claimed is:

1. A test circuit, comprising:
   a delay line containing a plurality of delay elements; and
   a test interface circuit coupled to the delay line, the test interface circuit comprising a multiplexer circuit that includes at least one multiplexer, the multiplexer circuit configured to operate in one of a normal mode and a test mode, wherein in the normal mode of operation the multiplexer circuit is operable to route a first clock into the delay line for implementing a desired delay upon the first clock, and wherein in the test mode of operation, the multiplexer circuit is configured to provide an option for selecting and routing into the delay line one of:
   a) a test clock for generating a system clock having known timing parameters, or
   b) a first steady state signal, the first steady state signal selected to be one of a logic high level or a logic low level for placing the delay line in an all-ones or an all-zero condition respectively for carrying out one of a) a stuck-at-zero test or b) a stuck-at-one test of the delay line.

2. The test circuit of claim 1, wherein the delay line is an analog delay line and each of the plurality of delay elements comprises logic gates arranged in a combinatorial circuit that is operative to provide a desired signal propagation delay through the combinatorial circuit.

3. The test circuit of claim 2, wherein the analog delay line contains a forward path, a reverse path, and a read path, for signal flow through the analog delay line.

4. The test circuit of claim 3, wherein the test circuit further comprises a memory storage element coupled to an intermediate location in the read path for reading a signal condition of the read path during the stuck-at-zero test or the stuck-at-one test.

5. The test circuit of claim 3, further comprising:
a first memory storage element coupled to a first location of the read path for reading a signal transmitted out of a first of the plurality of delay elements; and
a second memory storage element coupled to a second location of the read path for reading a signal transmitted out of a second of the plurality of delay elements.

6. The test circuit of claim 5, wherein the first and the second storage elements are coupled to each other as part of a test scan chain.

7. The test circuit of claim 3, wherein each of the plurality of delay elements is configurable to couple a signal from the forward path to the reverse path.

8. The test circuit of claim 3, wherein each of the plurality of delay elements includes a select line that is asserted to propagate a signal through the delay element along the forward path.

9. The test circuit of claim 8, wherein the select line is further asserted to route the signal from the forward path into the reverse path.

10. The test circuit of claim 1, wherein the multiplexer circuit comprises:
a first multiplexer having a first input terminal into which is coupled the test clock, a second input terminal into which is coupled the first steady state signal, an input-selector terminal into which is coupled a first control signal, and an output terminal that outputs a first multiplexer output signal; and
a second multiplexer having a first input terminal into which is coupled the first clock, a second input terminal into which is coupled the first multiplexer output signal, an input-selector terminal into which is coupled a second control signal, and an output terminal that outputs a second multiplexer output signal which is coupled into the delay line.

11. The test circuit of claim 10, further comprising an OR gate having a first input terminal into which is coupled the first steady state signal, a second input terminal into which is coupled a second steady state signal, and an output terminal that outputs the first control signal which is coupled into the input-selector terminal of the first multiplexer.

12. A test circuit, comprising:
a first delay line configured to provide a first delay path, the first delay line having a first delay line input into which is coupled a first signal, and a first delay line output which outputs a delayed first signal;
a second delay line configured to provide a second delay path that is not concatenated with the first delay path, the second delay line having a second delay line input into which is coupled a second signal that bears no relationship to the first signal, and a second delay line output which outputs a delayed second signal; and
a signal observation circuit configured for at least a) observing the first signal before and after propagating through the first delay line, or b) observing the second signal before and after propagating through the second delay line, the signal observation circuit comprising:
a first multiplexer circuit coupled to the first and the second delay line inputs, the first multiplexer circuit including a first select line operable to route out of the first multiplexer circuit one of a) the first signal or b) the second signal; and
a second multiplexer circuit coupled to the first and the second delay line outputs, the second multiplexer circuit including a second select line operable to route out of the second multiplexer circuit one of a) the delayed first signal or b) the delayed second signal.

13. The test circuit of claim 12, wherein each of the first and the second delay lines contains a forward path, a reverse path, and a read path, for signal flow through the delay line.

14. The test circuit of claim 13, wherein each of the first and the second delay lines contains a plurality of delay elements, and each of the delay elements includes a select line that is asserted to propagate a signal through the delay element along the forward path.

15. The test circuit of claim 14, wherein the select line is further asserted to route the signal from the forward path into the reverse path.

16. The test circuit of claim 12, wherein the first signal is a clock signal.

17. A test method, comprising:
routing a first clock through a delay line for implementing a desired delay on the first clock during a normal mode of operation; and
switching from the normal mode of operation to a test mode of operation, wherein the test mode of operation comprises:
propagating a test clock though the delay line for generating a system clock having known timing parameters; or
a stuck-at-one test and a stuck-at-zero test of the delay line, wherein the stuck-at-one test is performed by routing a logic high level into the delay line and the stuck-at-zero test is performed by routing a logic low level into the delay line.

18. The method of claim 17 wherein the delay line contains a plurality of delay elements each of which comprises logic gates arranged in a combinatorial circuit operative to provide a desired signal propagation delay through the combinatorial circuit.

* * * * *